United States Patent [19]
Christiansen et al.

[11] Patent Number: 4,589,584
[45] Date of Patent: May 20, 1986

[54] ELECTRICAL CONNECTION FOR POLYMERIC CONDUCTIVE MATERIAL

[75] Inventors: Robert A. Christiansen, Salvisa; Frank M. Rose, Jr., Nicholasville; James R. Smith, Cynthiana; Kenneth D. Woosley, Winchester, all of Ky.

[73] Assignee: International Business Machines Corporation, Armonk, N.Y.

[21] Appl. No.: 696,821

[22] Filed: Jan. 31, 1985

[51] Int. Cl.⁴ .............................................. B23K 20/10
[52] U.S. Cl. ..................................... 228/110; 228/4.5; 228/180.1; 156/73.4
[58] Field of Search ................. 228/1.1, 4.5, 110, 111, 228/44.7, 124, 179, 180.1, 180.2; 156/73.1, 73.2, 73.4, 580.1, 580.2

[56] References Cited

U.S. PATENT DOCUMENTS

| | | | |
|---|---|---|---|
| 3,725,164 | 4/1973 | Albinger et al. | 156/73.4 |
| 3,750,926 | 8/1973 | Sakamoto et al. | 228/110 X |
| 4,294,392 | 10/1981 | Colloff | 228/111 |

*Primary Examiner*—Kuang Y. Lin
*Attorney, Agent, or Firm*—Laurence R. Letson

[57] ABSTRACT

Flexible flat ribbon cables with a polyester binder silver particle conductive ink deposited on a heat bondable substrate are bonded to each other or to rigid circuit boards by applying ultrasonic energy to the cables. The conductors are bonded to form connections and are prevented from being deformed laterally to bridge to adjacent conductors due to preferential substrate bonding between adjacent conductors. Both apparatus for and the method of preferential substrate bonding is disclosed.

10 Claims, 5 Drawing Figures

ELECTRICAL CONNECTION FOR POLYMERIC CONDUCTIVE MATERIAL

FIELD OF THE INVENTION

The invention relates to the field of connecting flat ribbon cables to each other and/or to circuit boards and other circuit elements. More specifically, the invention relates to ultrasonic, thermal bonding of flat ribbon cables which have polymeric/silver ink conductors deposited upon a flexible substrate, to either other similar conductors or circuit boards having metallic conductors on the surface thereof.

BACKGROUND OF THE INVENTION

Flat flexible cables or ribbon cables are becoming more widely used in products such as typewriters, printers and microcomputers due to cost and ease of manufacture, and the need to accommodate component movement. The use of such flat ribbon cables requires them to be joined to other cables or circuit boards, most commonly by the use of plug-in connectors. With the reduced cost of flat ribbon cables, the connectors have become a very significant portion of the cost of the overall ribbon cable/connector assembly. In those environments where the cables are permanently attached to the circuits or other cables and do not need to be removed, connectors represent a substantial and unnecessary expense of manufacturing and assembly.

Also, it is becoming more commonplace to create circuits on flexible substrates to permit their conformation to other than planar shapes, and it is desirable to connect flat ribbon cables to these flexible circuits without the use of plug-in connectors. The use of connectors of a conventional type consume space which may be limited in the product.

Using commercially available products and techniques, connections may be made between flat ribbon cables with exposed flat conductors and other similar cables or rigid circuits having a uniform circuit pattern by using SCOTCHLINK Connector Tape available from 3M Corporation. SCOTCHLINK Connector Tape is a substrate which has on one surface thereof vapor deposited silver to form a conductive path, and then is coated with a heat sealable adhesive. Deposited onto the heat sealable adhesive are microscopic silver spheres such that when the material is used to bridge between two conductors, the adhesive holds the conductive bands in the appropriate spatial relationship and orientation to the conductors being connected and through heat and pressure is permanently bonded to the conductors. At the same time, the pressure forces the silver spheres to penetrate the adhesive layer and interconnect the vapor deposited silver conductive layer and the circuit or cable conductors.

The SCOTCHLINK Connector Tape connection is dependent upon the adhesive power of the adhesive coating to maintain continuity after the splicing has occurred.

OBJECTS OF THE INVENTION

An object of the invention is to provide an inexpensive technique for eliminating plug-in conductors for connecting flexible ribbon cables to other electrical conductor paths.

Another object of the invention is to provide a connector-less connection between flexible ribbon cables which is not dependent upon adhesion of an adhesive for permanence.

SUMMARY OF THE INVENTION

Flexible, flat ribbon cables are typically manufactured from a flexible polyethylene terephthalate substrate or similar flexible material, with conductive paths of a polyester binder having silver particles deposited thereon. When the binder solidifies, the silver particles are in sufficient contact with each other within the binder to provide conductive paths.

The flat ribbon cable which is to be bonded to a second ribbon cable is laid in an overlapping manner with the respective conductors in face to face relationship at the point where attachment will occur. The two flat ribbon cables are then held in the desired facing position and an ultrasonic bonding apparatus engaged with one substrate of said ribbon cables while the other substrate is backed by a rigid member or plate. Ultrasonic energy is applied to the overlaid ribbon cable structure to cause localized interface heating.

Either the face of the ultrasonic horn or the support plate is grooved such that it leaves ridges which spatially correspond with the spaces between the conductors of the flat ribbon cables to provide a preferential localized pressure to the substrate materials in areas where there is no conductive path. This preferential pressure causes a selective fusing of the two substrate materials between adjacent conductive paths, prior to the fusing of the respective polyester/silver ink paths. This selective fusing of the substrates prevents the bleeding of the conductive paths laterally and thereby prevents short circuiting between adjacent conductors.

The grooves, which are cut into the face of the ultrasonic horn or into the backing plate, relieve the pressure in the regions of the conductors thereby causing a concentration of pressure in regions between the conductors. This is significant in that ultrasonic heating and bonding is dependent upon the two articles, being joined, being forced together under pressure at the time that the vibratory ultrasonic energy is applied. This is done in order to secure sufficient temperature rise at the material interfaces to cause a bonding.

Additionally, the bonding of the substrate materials between the conductive paths acts to create a strain relief for the flat ribbon cables such that the substrate material will tend to maintain the junction in its bonded condition rather than relying on the relatively weak holding capability of the conductor material.

The shortcomings of the prior art are overcome and the advantages of the subject invention accomplished by the ultrasonic bonding of the ribbon cable to a second circuit element with preferential bonding of the substrates between the conductors. A better understanding may be had by referring to the attached drawings and the detailed description of the invention to follow.

DRAWINGS

DETAILED DESCRIPTION OF THE INVENTION

Figure 1:
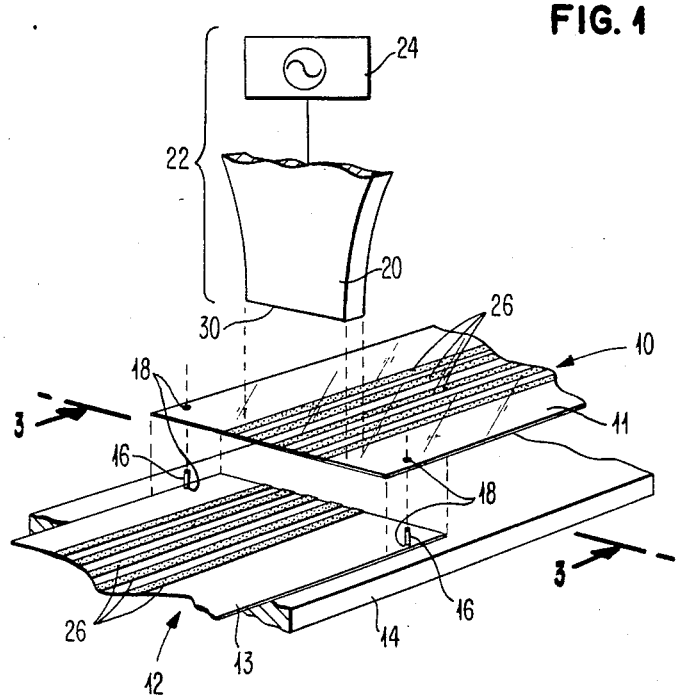
FIG. 1 is a perspective, exploded view of the bonding station and ribbon cables in position for joining the ribbon cables.

Referring to FIG. 1, there is illustrated a flat ribbon cable 10 positioned for joining to a similar ribbon cable 12 in superimposed, overlapping relation. Supporting the pair of ribbon cables 10, 12 is a support plate member 14 which supports and backs the substrate 13 of the second flat ribbon cable 12. The support plate 14 is also provided with locating dowels 16 so that holes 18 in the two flat ribbon cables 10, 12 may be placed thereover for precise positioning of the cables 10, 12 prior to the bonding operation. Positioned above the flat ribbon cables 10, 12 is the ultrasonic horn 20 of an ultrasonic bonding device 22. Such a horn 20 and ultrasonic generator 24 may be commercially procured from Branson Sonic Power Company. The horn 20 is brought into forcible engagement with the substrate 11 of the top flat ribbon cable 10 and the ultrasonic power applied therethrough by the ultrasonic generator 24. The techniques of ultrasonically bonding and sealing heat deformable plastic materials is well known and need not be described in detail.

Referring to the flat ribbon cables 10, 12, the substrates 11, 13 are made of a film material typically marketed under the trade name of MYLAR which is a polyethylene terephthalate material, marketed by DuPont, or MELINEX marketed by Imperial Chemical Industries.

Deposited on the substrates 11, 13 are conductors 26 which are made of a polyester binder material and silver particles in sufficient concentration that when the polyester binder solidifies, the silver particles are in sufficient contact with each other to form electrically conductive paths through the conductors 26. The polyester/silver mixture is available commercially from DuPont Corporation, Electro-Materials Corporation of America or Electro-Sciences Laboratories, Inc. DuPont markets its conductive inks under the designation of polymeric thick film materials for circuitry and several formulations are available within the conductor 5000 series, with the 5007 formulation the preferred ink. Electro-Materials Corporation of America distributes their conductive inks under the designation of Polymer Silver. Electro-Sciences Laboratories, Inc. designates its ink as 1110-5 conductive ink.

The horn 20 of the ultrasonic bonding device 22 will impart vibratory motion to the face to face engaged flat ribbon cables 10, 12 and, through the vibration thereof, generate sufficient heat to soften the polyester binder and to cause the two conductors 26 to be fused together, as one, in the region where the localized heating occurs under the horn 20. The substrates 11, 13 of the two flat ribbon cables 10, 12 will likewise be forced together and vibrated sufficiently to soften the substrates 11, 13 and cause their thermal fusing, thereby bonding the two substrates 11, 13 in face to face position. The bonding of the two flat ribbon cables 10, 12 requires that the bonding of the substrates 11, 13 occur preferentially prior to the time that there is sufficient heating of the conductors 26 to cause the conductors 26 to bleed or flow laterally. By bonding the substrates 11, 13 preferentially prior to the bleeding or flowing of the conductors 26 laterally, the possibility of short circuits between adjacent conductors 26 is eliminated. In effect, the preferential bonding causes dams, walls or seals to be formed between the adjacent conductors 26.

Figure 3:
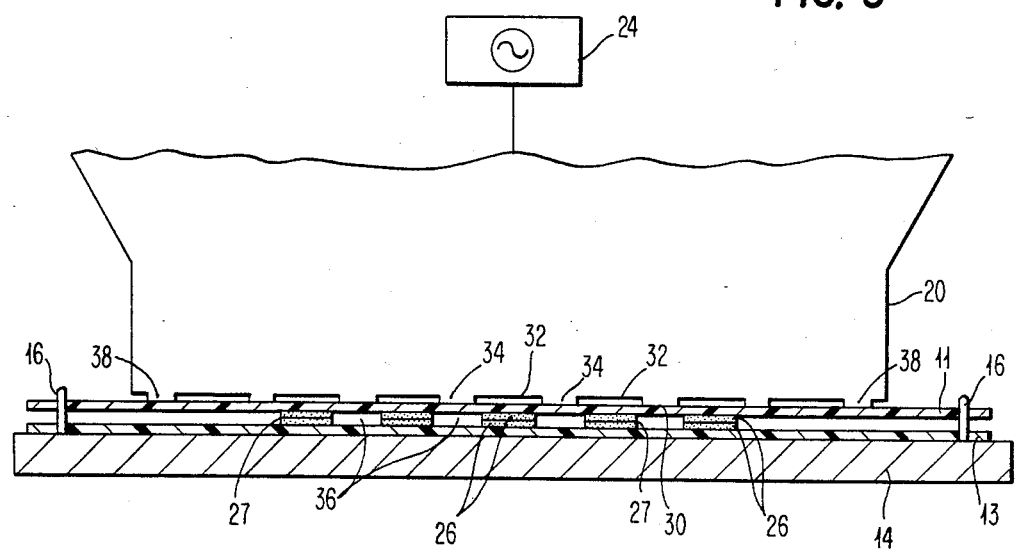
FIG. 3 is a sectional view of the ribbon cable structure in the bonding station, prior to bonding, taken along line 3—3 of FIG. 1.
Figure 4:
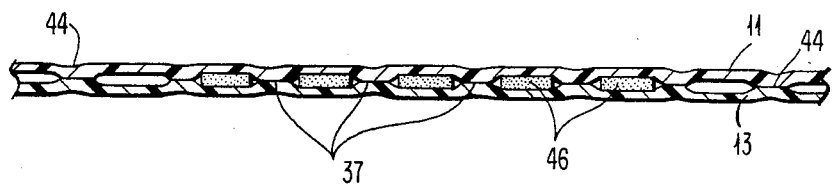
FIG. 4 is an enlarged sectional view of the ribbon cable structure of FIG. 3 after bonding.

The preferential bonding 37, FIG. 4, is accomplished through the forming of the engaging face of the ultrasonic horn 20 into a grooved surface wherein grooves 32 are cut into the otherwise flat surface 30 on the horn face, as can best be observed in FIG. 3. The grooves 32 are dimensioned such that they are wider than the conductors 26 and are positioned on centers at the same spacing as the conductors 26 to allow the grooves 32 to overlay the region where the conductor 26 is positioned.

The grooves 32 which are cut into the face 30 of the horn 20 leave behind ridges 34 intermediate adjacent grooves 32. The ridges 34 are slightly narrower than the gaps 36 between the adjacent conductors 26 and serve to concentrate pressure and vibratory movement into the region where the substrates 11, 13 of the flat ribbon cables 10, 12 are in face to face position without any conductors intermediate the substrates 11, 13. The ridges 34 therefore concentrate the initial ultrasonic energy and heating in regions between the conductors 26 to cause a fusing 37 of the substrate 11, 13 material prior to the softening, fusing and lateral bleeding of the conductor 26.

The grooves 32 are formed into the horn 20 to a depth of typically 0.0018 inches (approximately 0.046 mm) in order to accommodate the thickness of two conductors 26 between the substrates. The conductors 26 are typically silk screened or printed onto the substrate 11, 13 in sufficient material to leave a conductor 0.0005 inches (approximately 0.013 mm) nominal thickness. Thus, with the horn 20 and flat ribbon cables 10, 12 properly positioned, the initial vibratory heating generated by the ultrasonic bonding device 22 is localized between spaced apart conductors 26, and as heating occurs and the substrates 11, 13 soften and fuse into dams 37, the horn 20 is allowed to move toward the backing plate 14 slightly. The horn 20 then firmly engages the substrate 11 in the region carrying the conductors 26, thus causing a localized heating at the interface 27 between the conductors 26.

Localized heating and resulting softening will permit the conductors 26 to deform and fuse into one electrically conductive body. Some slight lateral bleeding may occur at this point. However, this bleeding will not be of significance since the substrates 11, 13 will have already been vibratorily fused into dams 37 in regions adjacent the bleeding and therefore prevent the electrically conductive material from bridging to the next adjacent conductor 26.

Nominally, the pressure exerted by the ultrasonic generator on the substrate is in the order of 20 PSI and the amount of time necessary for adequate ultrasonic bonding is in the order of 0.2 second of energy applied to the ribbon cable structure 10, 12.

Each minor amount of experimentation may be necessary in order to optimize the pressure and residence time of the horn 20 during vibration, depending on the particular materials selected.

Figure 2:
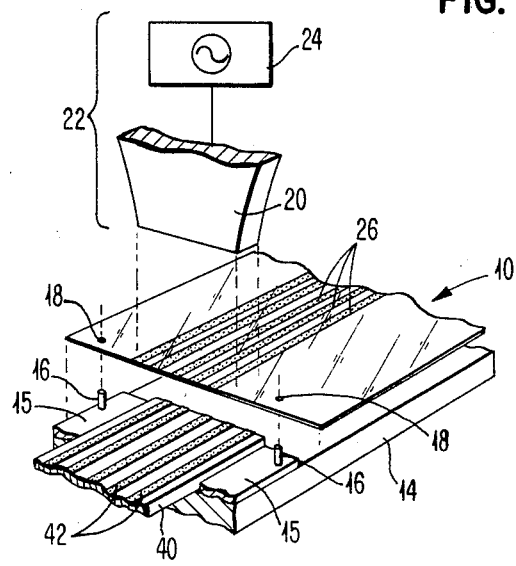
FIG. 2 is a perspective exploded view similar to FIG. 1 except that a circuit board is substituted for one ribbon cable.

Referring to FIG. 2, it can be seen that the flexible flat ribbon cable 10 may be rigidly attached to a rigid circuit board 40 having copper conductive lands 42 deposited thereon.

The preferential bonding intermediate conductors 26, 42 still occurs with the material of the circuit board 40, thus preventing the bleeding of the conductor 26 on the flat ribbon cable 10, when the conductor 26 is bonded.

The attaching of the flat ribbon cable 10 to either a second flat ribbon cable 12 or a rigid printed circuit board 40 may be further stabilized by forming raised bosses 38 in the order of 0.001 of an inch height on the face 30 of the horn 20 as viewed in FIG. 3. This provides a localized spot fusing 44 of the flat ribbon cable substrate 11 to either substrate 13 of flat ribbon cable 12 to which it is bonded or the substrate of the printed circuit board 40. Thus, additional fusing 44 creates a strain relief to inhibit the tearing apart of the fused conductor junction 46 as seen in FIG. 4.

The circuit board 40 should be confined by positioning blocks 15 on backing plate 14 to insure proper alignment of the circuit board during bonding.

When properly adhered through the ultrasonic bonding process described above, the pull strength of the fused connection is sufficient for most environments where there will be a minimal amount of stress applied to the conductors 26 and will provide at least a pull strength equal to or greater than that which would be present in the event that plug-in connectors had been used.

This approach to joining flexible flat ribbon connections is useable where the electrically conductive paths on the ribbon cables are regularly or at least consistently spaced and that there is sufficient quantity to join to justify the expense involved in securing a horn 20 for the ultrasonic generator 24 with the appropriate groove 32 and ridge 34 pattern therein.

Figure 5:
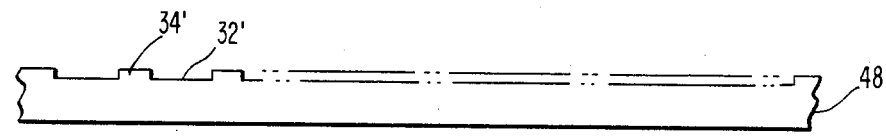
FIG. 5 is a sectional view of a grooved support plate.

When joining a flat ribbon cable 10 to a circuit board 40, it is necessary to have the growing formed into the face of the ultrasonic horn 20. FIG. 5 illustrates a support plate 48 which has grooves 32' and ridges 34'. Support plate 48 is used with a horn 20 with a smooth face 30 and functions in an analogous manner to that described above to bond two flat ribbon cables.

While several different embodiments have been disclosed, changes may be made by one of skill in the art without departing from the scope of the invention.

I claim:

1. The method of joining electrical conductor assemblies comprising electrical conductors of a thermally deformable conductive material carried upon thermally bondable substrates, said method comprising the steps of
    placing one conductor assembly in face to face engagement with a second conductor assembly with said conductors in contacting relation,
    supporting said plurality of assemblies;
    engaging said plurality of assemblies in such a manner as to exert a force against said assemblies;
    applying a high frequency vibratory energy to said assemblies to create localized heating at interfaces between said assemblies;
    fusing said substrates in regions not covered by said conductors and subsequent thereto;
    fusing said conductors.

2. The method of joining a multiple thermally deformable conductor flexible electrical member to an electrical member having a like number of conductors and said conductors spaced in a pattern to permit face to face engagement comprising the steps of:
    positioning said flexible electrical member and said electrical member in face to face position with said conductors of said flexible electrical member to be joined, in contact with the conductors of said electrical member;
    preferentially bonding said members in regions intermediate said conductors;
    subsequently bonding said conductors.

3. The method of claim 2 wherein said flexible electrical member is a flat ribbon cable, and said member or electrical component with a thermally bondable substrate.

4. The method of claim 2 wherein both said members are flat ribbon cables.

5. The method of claim 2 further comprising the step of ultrasonically vibrating said members while in face to face position to soften and fuse said substrate and said conductors.

6. The method of claim 3 further comprising the step of ultrasonically vibrating said members while in face to face position to soften and fuse said substrates and said conductors.

7. The method of claim 4 further comprising the step of ultrasonically vibrating said members while in face to face position to soften and fuse said substrate and said conductors.

8. The method of joining at least two electrical conductor members formed of thermally bondable material deposited upon respective insulating substrates, each of said members comprising a plurality of spaced conductors, said substrates made of a plastic, thermally bondable material comprising the steps of:
    providing said electrical conductors and said insulating substrates;
    placing said insulating substrates in face to face relation with said electrical conductors in face to face overlapping contact;
    supporting said substrates in said face to face overlapping contact relation in a rigid surface;
    holding said substrates in said relation; and
    applying high frequency vibratory energy to said one of said substrates to selectively and preferentially to fuse said substrates intermediate said conductors to each other and subsequently said conductors to each other.

9. The method of claim 8 wherein said engaging step further comprises exerting a force onto said one of said substrates in localized regions proximate said conductors to selectively and preferentially fuse said substrates, thereby preventing undue movement of conductor material upon fusing of said conductors.

10. The method of claim 9 wherein each said substrate is provided with a plurality of said conductors and said regions are intermediate said conductors, thereby preventing conductor material from bridging between adjacent conductors.

* * * * *